United States Patent

Kiryu et al.

[11] Patent Number: 5,368,962
[45] Date of Patent: *Nov. 29, 1994

[54] MASKING FILM

[75] Inventors: Naohiko Kiryu, Urawa; Hiroshi Maruyama; Etsuko Minezaki, both of Misato; Yoshinori Watanabe, Chiba, all of Japan

[73] Assignee: Somar Corporation, Japan

[*] Notice: The portion of the term of this patent subsequent to May 15, 2007 has been disclaimed.

[21] Appl. No.: 913,414

[22] Filed: Jul. 15, 1992

Related U.S. Application Data

[63] Continuation-in-part of Ser. No. 433,169, Nov. 8, 1989, abandoned.

[30] Foreign Application Priority Data

Nov. 10, 1988 [JP] Japan .................. 63-284163
Apr. 3, 1989 [JP] Japan .................. 1-85603
Apr. 11, 1989 [JP] Japan .................. 1-90997

[51] Int. Cl.$^5$ ............................. G03F 9/00
[52] U.S. Cl. ........................ 430/7; 430/507; 430/510; 430/512; 428/40; 428/333; 428/412; 428/476.3; 428/483; 428/500
[58] Field of Search ............. 430/7, 507, 510, 512, 430/396; 428/40, 333, 412, 476.3, 483, 500

[56] References Cited

U.S. PATENT DOCUMENTS

| | | | |
|---|---|---|---|
| 3,619,335 | 11/1971 | Bryan . | |
| 3,892,900 | 7/1975 | Shima et al. . | |
| 4,923,726 | 5/1990 | Maruyama et al. | 428/40 |
| 4,923,727 | 5/1990 | Maruyama et al. | 428/40 |
| 4,925,713 | 5/1990 | Kiryu et al. | 428/40 |
| 4,937,116 | 6/1990 | Kizawa et al. | 428/40 |
| 5,009,944 | 4/1991 | Maruyama et al. | 428/40 |
| 5,043,198 | 8/1991 | Maruyama et al. | 428/40 |
| 5,085,908 | 2/1992 | Sano et al. | 428/40 |

FOREIGN PATENT DOCUMENTS

| | | |
|---|---|---|
| 188292 | 7/1986 | European Pat. Off. . |
| 360943 | 4/1990 | European Pat. Off. . |
| 2206866 | 6/1974 | France . |
| 2019723 | 10/1970 | Germany . |
| 802811 | 5/1955 | United Kingdom . |
| 1166724 | 10/1969 | United Kingdom . |

Primary Examiner—Charles L. Bowers, Jr.
Assistant Examiner—Geraldine Letscher
Attorney, Agent, or Firm—Lorusso & Loud

[57] ABSTRACT

A lightsafe masking film is disclosed which includes a transparent substrate, and a transparent, lightsafe layer peelably provided over the surface of the substrate and containing a light yellow colorant and a blue colorant so that the color of the lightsafe layer is light green. The spectral transmittance of the lightsafe layer does not exceeds 1% in the wavelength region of between 350 nm and $L_{max}$, wherein $L_{max}$ is 420 nm or more, but exceeds 1% in the wavelength region of longer than $L_{max}$ with the maximum spectral transmittance of the lightsafe layer in the wavelength region of 500–570 nm being greater than 50%. The light green masking film is suitably used together with a conventional yellow or amber masking film for masking a photosensitive material in photomechanical reproduction process.

2 Claims, 2 Drawing Sheets

MASKING FILM

CROSS-REFERENCE TO RELATED APPLICATION

This application is a continuation-in-part of U.S. Ser. No. 07/433,169 filed Nov. 8, 1989, now abandoned.

BACKGROUND OF THE INVENTION

This invention relates generally to a lightsafe masking film and, more specifically, to a composite, lightsafe masking film to be used for masking a portion of a photosensitive material during exposure to actinic light in the photomechanical reproduction process. The present invention is also directed to an exposure method using the above lightsafe material.

One known lightsafe masking film of this type is composed of a plastic film substrate and a peelable, lightsafe layer provided thereon. When a desired cutting line is formed on the lightsafe layer manually or with a suitable automatic cutting device and when the cut portion is removed by peeling, there leaves a desired transparent pattern (window) on the masking film. A photosensitive material is then exposed to light through the resulting masking film and a negative so that the a positive is obtained on the photosensitive material at a position corresponding to the window of the masking film.

The lightsafe layer is generally comprised of a colorant functioning as a lightsafe substance. The colorant conventionally used is predominantly a red colorant because of its good light-blocking characteristics. Lightsafe masking films with a reddish color, however, suffer from a drawback that cutting works and succeeding peeling works become inefficient since the red color of the film causes eyes of the workers to be strained and taxed. This also applies to yellow lightsafe masking films. Whilst the use of a masking film employing a green colorant could improve the workability, such a film in turn causes a problem of poor light-blocking property.

In a color photomechanical reproduction process, an original color film to be processed is first scanned with a color scanner to form a monochromatic negative for each of the four separated, cyan, magenta, yellow and black colors. When legends, illustrations, screen tints and the like modifications are to be incorporated, corresponding negatives are also prepared. These negatives are then assembled for each of the four colors. A positive film is then produced by repeated exposure of a photosensitive material, such as of a silver halide-type or a photoresin-type, through respective four assembled negatives. In this case, lightsafe masking films are used for masking desired portions of the photosensitive material.

As the masking films used in the above-described process for the production of a positive pattern, there have been used those having yellow or amber colors as mentioned previously. Since a lot of masks with different cut patterns are to be used in each exposure step, mistakes such as failure to cut and peel the masking layers have often been experienced. Further, it has been very troublesome to determine which patterns of negatives are deles (or stets).

SUMMARY OF THE INVENTION

The present invention is contemplated to solve the problem of the conventional lightsafe masking film.

In accordance with the present invention there is provided a lightsafe masking film comprising a transparent substrate, and a transparent, lightsafe layer peelably provided over the surface of said substrate and containing a light yellow colorant and a blue colorant so that the color of the lightsafe layer is light green and the spectral transmittance of the lightsafe layer does not exceeds 1% in the wavelength region of between 350 nm and $L_{max}$, wherein $L_{max}$ is 420 nm or more, but exceeds 1% in the wavelength region of longer than $L_{max}$ with the maximum spectral transmittance of the lightsafe layer in the wavelength region of 500–570 nm being greater than 50%.

In another aspect, the present invention provides an exposure method wherein a photosensitive material is exposed to actinic light while masking desired portions thereof with lightsafe mask means, said method being characterized in that at least two different, first and second masking layers are used as said lightsafe mask means, that said first masking layer has a light green color and said second masking layer has a yellow or amber color and that said first masking layer contains a light yellow colorant and a blue colorant so that the color of said first lightsafe layer is light green and the spectral transmittance of the first masking layer does not exceeds 1% in the wavelength region of between 350 nm and $L_{max}$, wherein $L_{max}$ is 420 nm or more, but exceeds 1% in the wavelength region of longer than $L_{max}$ with the maximum spectral transmittance of the first masking layer in the wavelength region of 500–570 nm being greater than 50%.

In a further aspect, the present invention provides a lightsafe masking film comprising a transparent substrate, and a transparent, lightsafe layer peelably provided over the surface of said substrate and containing a light yellow colorant and a blue colorant so that the color of the lightsafe layer is light green and the lightsafe layer can block light having a wavelength of 450 nm or less.

In yet a further aspect, the present invention provides an exposure method wherein a photosensitive material is exposed to actinic light while masking desired portions thereof with lightsafe mask means, said method being characterized in that at least two different, first and second, transparent masking films are used as said lightsafe mask means, that said first masking film has a light green color and said second masking film has a yellow or amber color and that said first masking film contains a light yellow colorant and a blue colorant so that the color of said first masking film is light green and the lightsafe layer can block light having a wavelength of 450 nm or less.

BRIEF DESCRIPTION OF THE DRAWING

Other objects, features and advantages of the present invention will become apparent from the detailed description of the preferred embodiments of the invention which follows, when considered in light of the accompanying drawing, in which.

DETAILED DESCRIPTION OF THE PREFERRED EMBODIMENTS OF THE INVENTION

Figures 1A, 1B:
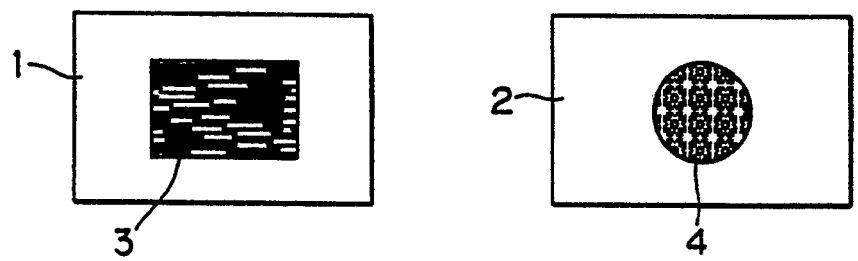
FIGS. 1(a) and 1(b) are illustrations showing negative films for forming a positive.
Figures 2A, 2B:
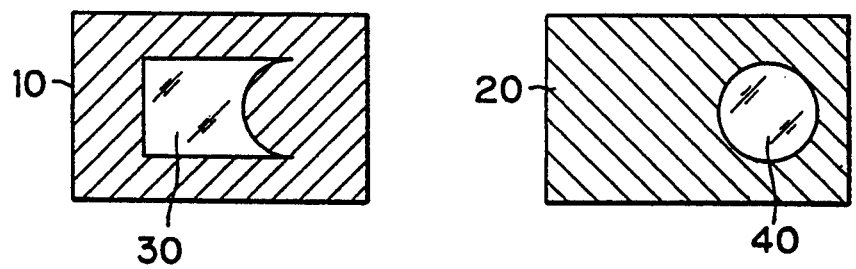
FIGS. 2(a) and 2(b) are illustrations of lightsafe masking films having portions thereof removed.

Lightsafe masking film according to the present invention is comprised of a transparent substrate formed of a plastic material having provided thereon a peelable, transparent, lightsafe layer.

Any plastic material conventionally used as a substrate in known lightsafe masking films can be used for the purpose of the present invention. Transparent plastic films such as polyester films (e.g. polyethylene terephthalate films, polybutylene terephthalate films and polyoxybenzoate films) and polycarbonate films may be suitably used as the substrate. Both stretched and unstretched films may be used. The thickness of the film is generally in the range of 20–300 μm, preferably 25–250 μm.

The substrate is overlaid with a peelable, lightsafe layer generally composed of (i) a binder such as a synthetic rubber, e.g. a nitrile rubber, or a synthetic resin, e.g. a vinyl chloride/vinylidene chloride copolymer or a vinyl chloride/vinyl acetate copolymer, and (ii) a lightsafe or light-shading substance. Any binder customarily used in lightsafe layer of known masking films may be used for the purpose of the present invention. The lightsafe layer may further contain one or more additives such as fillers used in conventional masking films, if desired. The lightsafe layer generally has a thickness of 20–50 μm, preferably 23–43 μm.

In the present invention, a mixture of a yellow colorant and a blue colorant is used as the lightsafe substance so that the lightsafe layer containing such a mixed colorants has a light green color and the spectral transmittance (light transmissivity) of the lightsafe layer is not greater than 1% in any wavelength range of between 350 and $L_{max}$ wherein $L_{max}$ is 420 nm or more. Thus, the lightsafe layer substantially completely block light having a wavelength of 350 to $L_{max}$ so that when a roomlight photosensitive film is exposed with UV rays, a desired portion masked with the lightsafe masking film can remain substantially unexposed. The spectral transmittance of the light safe layer, however, exceeds 1% in a wavelength of longer than $L_{max}$ and 50% in a wavelength range of between 500–570 nm. Thus, the lightsafe layer can substantially completely block light of a wavelength which is not longer than $L_{max}$. The wavelength $L_{max}$ is termed "maximum light-blocking wavelength" in the present specification. The maximum light-blocking wavelength is generally in the range of 420–470 nm.

For reasons of obtaining suitable light green tone, it is preferred that the lightsafe layer of the present invention have the following characteristics:

(a) the optical density $D_b$ through a blue filter is 0.9–2.0;
(b) the optical density $D_g$ through a green filter is 0.5 or less, more preferably 0.05–0.45;
(c) the optical density $D_r$ through a red filter is 0.4 or more, more preferably 0.4–2.7; and
(d) the ratio $D_g/D_r$ is 0.7 or less, more preferably 0.05–0.6.

The term "optical density" used in the present specification is intended to refer to that measured by Macbeth Optical Densitometer TD904 using a combination of wratten 47 and CC-40M filters as the blue filter, a wratten 92 filter as the red filter and a wratten 93 filter as the green filter.

As a consequence of the above characteristics, the lightsafe masking film according to the present invention shows satisfactory light-blocking property, seeing through property and peculiar color tone so that it permits easy and efficient cutting works, raising and peeling works and masking works. In particular, when an original is overlaid with a dark green masking film for forming cut lines, the pattern of the original becomes vague and is difficult to trace. In contrast, with the masking film according to the present invention, since the lightsafe layer is light green, patterns of the original are seen clearly through the masking film placed on the original, thereby to permit easy formation of cut lines by tracing. Further, the use of the green masking film in conjunction with another ordinary masking film having different color such as yellow or amber can facilitate the production of a positive film by exposure through masked negatives.

Desired degree of light blocking depends upon the manner in which the lightsafe masking film is used and upon the kind of the photosensitive film to be masked thereby. In general, when the number of light exposure is one or two, it is not necessary to completely block light. Namely, as long as the lightsafe layer exhibits such a lightsafe property that the spectral transmittance thereof is not greater than 1%, preferably not greater than 0.5%, in the wavelength region of from 350 nm to the maximum light-blocking wavelength, then the portion of an ordinary photosensitive film which is masked with the lightsafe layer remains substantially unexposed. On the other hand, when the exposure is repeated a number of times (say 10 times), then the lightsafe layer is required to exhibit such a lightsafe property that the spectral transmittance thereof is not greater than 0.2%, preferably not greater than 0.1%.

The light yellow colorant to be used in the present invention is preferably a lemon color colorant having the maximum light-blocking wavelength of 420 or more and exhibiting optical densities of 0.9–2.0 through a blue filter, 0.5 or less through a green filter and lower than 0.4 through a red filter. Examples of the light yellow colorant include Savinyl Yellow RLS (C. I. Solvent Yellow 83), Aizen SOT Yellow-1 (C. I. Solvent Yellow 56), Mihara Oil Yellow 3G, Neo Zapon Yellow 018 (C. I. Solvent Yellow 79), Orsaol Yellow 2GLN (C. I. Solvent Yellow 88), Savinyl Yellow 2GLS (C. I. Solvent Yellow 79), Vali Fast Yellow 1103, Vali Fast Yellow 2110 (C. I. Solvent Yellow 79), Vali Fast Yellow 1101, Vali Fast Yellow 1105, Mihara OI1 Yellow 5G, 30 Mihara Oil Yellow 10G, Kayaset Yellow K-RL, Oil Yellow 101 (C. I. Solvent Yellow 34), Oil Yellow 107 (C. I. Solvent Yellow 42), Oil Yellow D (C. I. Solvent Yellow 93), Neo Super Yellow C-131 (C. I. Solvent Yellow 21), and Neo Super Yellow C-132 (C. I. Solvent Yellow 151). These light yellow colorants may be used either by themselves or in combination of two or more.

Any blue colorant may be used for the purpose of the present invention as long as it can give a lightsafe layer having the above-mentioned characteristics when used in combination with the yellow colorant. Examples of such blue colorant include Vali Fast Blue 1505 (Color Index (C. I.) Solvent Blue 38), Vali Fast Blue 2606 (C. I. Solvent Blue 20), Savinyl Blue GLS (C. I. Solvent Blue 44), Nozapon Blue 807 (C. I. Solvent Blue 70), Neo Super Blue C-531 (C. I. Solvent Blue 70), Neo Super Blue C-551 (C. I. Solvent Blue 70), Orasol Blue 2GLN, Orasol Blue GN and Oil Blue BO (C. I. Solvent Blue 25). These blue colorants may be used singly or in combination of two or more.

The yellow and blue colorants are used in an amount so that the lightsafe layer is imparted with desired light-blocking properties but is kept transparent. The total amount of the yellow and blue colorants in the lightsafe layer is generally 2–50% by weight, preferably 5–30% by weight.

It is preferred that a UV ray absorbing agent be incorporated into the lightsafe layer of the masking film of the present invention for reasons of improved light-blocking properties. Any known UV absorbing agent may be used. Salicilic acid esters, benzotriazols and benzophenones are examples of such UV ray absorbing agent. Of these, benzophenones (benzophenone or substituted benzophenones) are particularly preferred for reasons of freeness of bleeding from the lightsafe layer. The UV ray absorbing agent is generally used in an amount of 0.05–1.0 part by weight, preferably 0.1–0.7 part by weight per part by weight of the mixed blue and yellow colorants. The use of the UV ray absorbing agent in conjunction with the mixed colorants can provide a lightsafe layer with suitable light-blocking properties.

If desired, a pressure sensitive adhesive layer may be interposed between the substrate and the lightsafe layer so that a portion of the lightsafe layer once peeled off from the substrate may be resticked to the substrate for reuse of the masking film. Such an adhesive layer is formed of a synthetic resin adhesive such as an acrylate ester copolymer, a saturated polyester or a polyurethane, or a rubber adhesive such as a natural rubber, a chloroprene rubber or a nitrile rubber.

When such a pressure sensitive adhesive layer is provided between the substrate and the lightsafe layer, it is preferred that the lightsafe layer be comprised of (A) nitrile rubber, (B) nitrocellulose, (C) plasticizer and (D) the mixed lightsafe colorants as mentioned above, for reasons of improved surface nontackiness.

The nitrile rubber (A) is, for example, a copolymer of acrylonitrile and other copolymerizable monomer, such as a copolymer of acrylonitrile and butadienen or a terpolymer of acrylonitrile, butadiene and a carboxyl group-containing monomer, and preferably has an acrylonitrile content of 19–51% by weight. The nitrile rubber imparts suitable adhesiveness and suitable peelability to the lightsafe layer.

The nitrocellulose (B) serves to function as a tackiness reducing agent in cooperation with the nitrile rubber. The nitrocellulose having a nitrogen content of 10.7–12.2% by weight is preferably used.

The plasticizer (C) serves to improve the flexibility of the lightsafe layer so that the layer can be peeled off without breakage or damage and can be reused for resticking. Examples of such plasticizers include fatty acid esters, preferably those having a molecular weight of 300–500, trimellitic acid esters, preferably those having a molecular weight of 500–700, epoxidized fatts and fatty oils (glycerides), preferably those having a molecular weight of about 300–1300, and epoxidized fatty acid esters (non-glycerides), preferably those having a molecular weight of about 300–1300. Illustrative of suitable plasticizers are di(butoxyethoxyethyl) adipate, trioctyl trimellitate, epoxidized soybean oil, epoxidized linseed oil, methyl epoxystearate, butyl epoxystearate, octyl epoxystearate and di(2-ethylhexyl) epoxyhexahydrophthalate.

The above four ingredients are used in the following proportions. The weight ratio of (A) to (B) is generally from 20:80 to 80:20, preferably from 30:70 to 70:30. The amount of (C) is generally from 0.1 to 30 parts by weight, preferably from 0.5 to 20 parts by weight per 100 parts by weight of total resin solids in (A) and (B). The amount of the mixed lightsafe colorants (D) is generally from 3 to 30 parts by weight, preferably from 5 to 20 parts by weight per 100 parts by weight of total resin solids in (A) and (B).

In addition to the four ingredients (A)–(D), the lightsafe layer to be provided over the surface of the adhesive layer can contain an organic compound such as benzoguanamine resin or an inorganic compound such as silica, both of which are incompatible with the four ingredients (A)–(D). The addition of such compounds prevents the reflection of light from the surface of the lightsafe layer and reduces the surface tackiness thereof. Such an additive is generally used from 0.1 to 20 parts by weight per 100 parts by weight of total resin solids in (A) and (B).

The lightsafe masking film may be fabricated in any known manner, for example, by applying coatings of respective coating compositions successively on a substrate. Organic solvent or solvents are used for the formation of coating compositions which may be in the form of a dispersion or solution. If desired, a portion of the colorants to be incorporated into the lightsafe layer may be incorporated into an overcoat layer provided over the lightsafe layer, an undercoat layer (such as the above described pressure sensitive adhesive layer) provided beneath the lightsafe layer.

The lightsafe masking film according to the present invention is suitably used for the masking of a roomlight photosensitive material, such as of a silver halide-type or a photoresin-type, which is sensitive to light with wavelengths of 400 nm or less.

The following examples will further illustrate the present invention. In the Examples, "part" is by weight.

EXAMPLE 1

A coating liquid having the composition shown in Table 1 below was prepared.

TABLE 1

| Ingredient | Amount (parts) |
| --- | --- |
| Colorant YL-1*[1] | 4.0 |
| Colorant YL-2*[2] | 2.41 |
| Colorant BL-1*[3] | 0.275 |
| UV ray absorbing agent*[4] | 1.5 |
| Acrylonitrile/butadiene rubber*[5] | 30 |
| Vinyl chloride/vinylidene chloride copolymer*[6] | 70 |
| Tackiness reducing agent*[7] | 1.5 |
| Methyl ethyl ketone | 439 |

*[1]: Yellow colorant (Oil Yellow 101, C.I. Solvent Yellow 34, Orient Chemical Industry Co., Ltd.)
*[2]: Yellow colorant (Vali Fast Yellow 4120, C. I. Solvent Yellow 82, Orient Chemical Industry Co., Ltd.)
*[3]: Blue colorant (Neozapon Blue 807, C.I. Solvent Blue 70)
*[4]: 2,2',4,4'-tetrahydroxybenzophenone
*[5]: Nypol 1042, Nihon Zeon Inc., Acrylonitrile conent: 33 wt %
*[6]: VYHH, Union Carbide Inc., vinyl chloride content: 86%
*[7]: Silica (Syloid 74, Fuji-Devitson Inc.)

Figure 4:
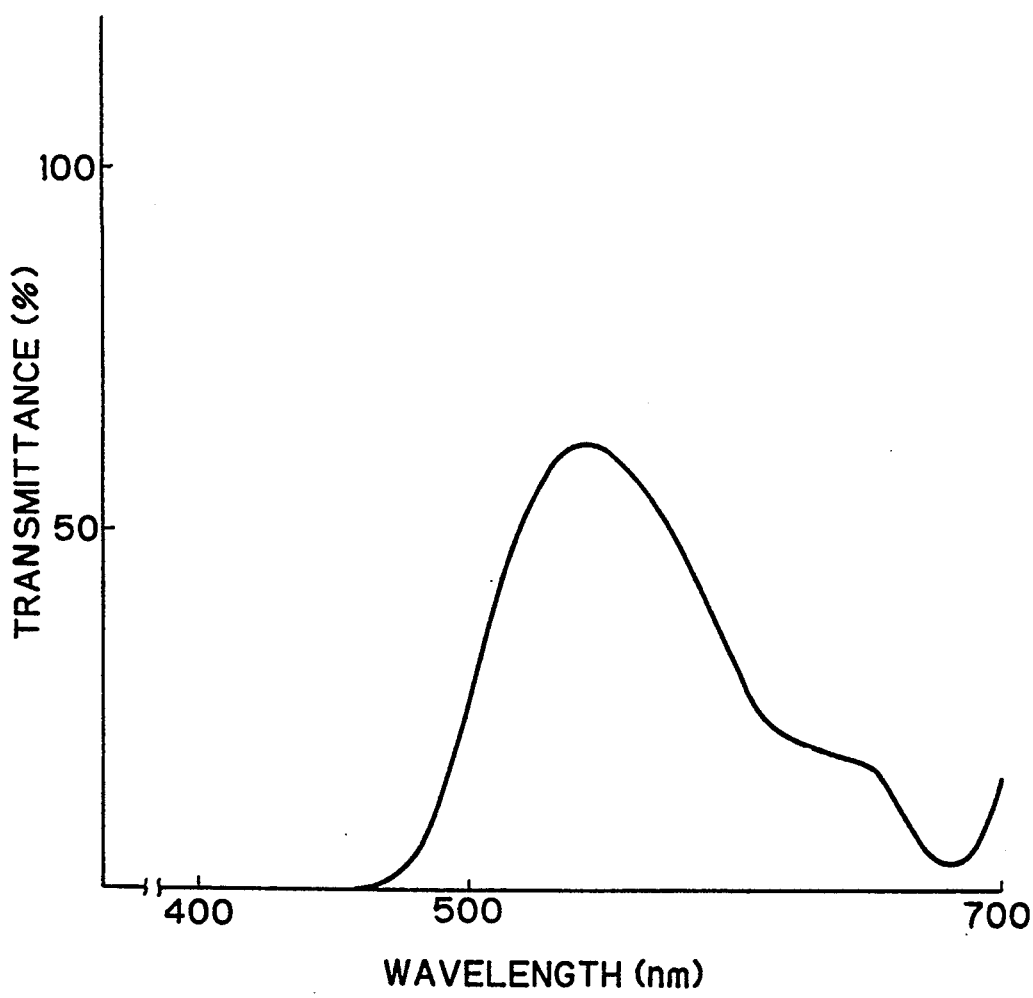
FIG. 4 is a spectral transmittance chart showing a relationship between wavelength and spectral transmittance of a masking film of the present invention.

The coating liquid was applied to the surface of a polyethylene terephthalate film (thickness: 100 μm) and the coated layer was dried to obtain a masking film having a light green, peelable, lightsafe layer having a thickness of 25 um. The masking film was able to block light having a wavelength of 450 nm or less and showed a spectral transmittance peak at 545 nm as shown in FIG. 4. The transmittance at that peak was over 50%. The masking film was superimposed on an original and cut lines were manually formed by tracing with a knife. The pattern of the original was clearly seen through the film. The cutting works was able to be carried out efficiently without encountering eye strain problems. The film was found to be effectively used for masking a roomlight photosensitive material.

EXAMPLE 2

A polyethylene terephthalate film (thickness: 100 μm) was coated with a chloroprene-containing pressure sensitive adhesive layer (thickness after drying: 3 μm). Then the above coating liquid identical to that used in Example 1 was applied to the surface of the adhesive layer and the coated layer was dried to obtain a masking film having a peelable, lightsafe layer (thickness: 40 μm) provided on the adhesive layer. The masking film exhibited light-blocking and spectral transmittance characteristics similar to that of Example 1. A portion of the lightsafe layer was cut and peeled off from the substrate. The peeled portion was able to be sticked on the former position.

EXAMPLE 3

A master liquid having the following composition was prepared:

| | |
|---|---|
| Acrylonitrile/butadiene rubber | 90 parts |
| Vinyl chloride/vinyl acetate copolymer | 210 parts |
| Surface roughening agent | 3.2 parts |
| Methyl ethyl ketone | 1141 parts |

Using the above master liquid, a coating liquid having the following composition was prepared:

| | |
|---|---|
| Master liquid | 100 parts |
| Oil Yellow 101 | 0.9 part |
| Vali Fast Blue 2606 | 0.2 part |

The coating liquid was applied onto a polyethylene terephthalate film to a thickness of 25 μm to obtain a lightsafe masking film. The sprectal transmittance of this film was found to below 1% within the wavelength range of 350–420 nm. This film had good light-blocking property.

COMPARATIVE EXAMPLE 1

Example 3 was repeated in the same manner as described except that Spilon Yellow C-GNH (0.83 part) was used in place of the Oil Yellow 101. The spectral transmittance was found to exceed 1% in the wavelength range of 350–385 nm. This film had poor light-blocking property.

COMPARATIVE EXAMPLE 2

Example 3 was repeated in the same manner as described except that Neozapon Yellow GG (0.5 part) was used in place of the Oil Yellow 101. The spectral transmittance was found to exceed 1% in the wavelength range of 350–420 nm. This film had poor light-blocking property.

EXAMPLE 4

Using the above master liquid and yellow and blue colorant indicated in Table 2, coating liquids having the compositions shown in Table 2 were prepared. In Table 2, the blue colorant BL-1 and the yellow colorant YL-1 are identical to those used in Example 1. The yellow colorant YL-3 represents Savinyl Yellow RLS. Each coating liquid was applied to a 100 μm terephthalate film to a thickness of 24 μm to obtain a lightsafe masking film. The sprectal transmittance and optical density of each of the thus obtained masking films were measured and the results are shown in Table 2.

TABLE 2

| Sample No. | Yellow colorant | Amount Yellow colorant | Amount Blue colorant | Optical density Dr red | Optical density Dg green | Optical density Db blue | Dg/Dr ratio | Color tone |
|---|---|---|---|---|---|---|---|---|
| 1 | YL-1 | 0.18 | 0.01 | 0.22 | 0.08 | 1.03 | 0.36 | greenish light yellow |
| 2 | YL-1 | 0.18 | 0.02 | 0.44 | 0.10 | 1.05 | 0.23 | light green |
| 3 | YL-1 | 0.18 | 0.03 | 0.61 | 0.13 | 1.06 | 0.21 | light green |
| 4 | YL-1 | 0.18 | 0.04 | 0.80 | 0.15 | 1.06 | 0.19 | light green |
| 5 | YL-1 | 0.18 | 0.06 | 1.14 | 0.19 | 1.06 | 0.16 | light green |
| 6 | YL-1 | 0.18 | 0.09 | 1.66 | 0.25 | 0.52 | 0.15 | light green |
| 7 | YL-3 | 0.36 | 0.01 | 0.27 | 0.35 | 2.70 | 1.29 | greenish yellow |
| 8 | YL-3 | 0.36 | 0.02 | 0.51 | 0.40 | 2.73 | 0.78 | dark green |
| 9 | YL-3 | 0.36 | 0.04 | 0.83 | 0.46 | 2.81 | 0.55 | dark green |
| 10 | YL-3 | 0.36 | 0.06 | 1.21 | 0.50 | 2.81 | 0.41 | dark green |
| 11 | YL-3 | 0.36 | 0.08 | 1.48 | 0.53 | 2.80 | 0.39 | dark green |
| 12 | YL-3 | 0.36 | 0.10 | 1.83 | 0.58 | 2.79 | 0.31 | dark green |
| 13 | YL-3 | 0.36 | 0.12 | 2.18 | 0.63 | 2.85 | 0.28 | dark green |
| 14 | YL-3 | 0.36 | 0.14 | 2.69 | 0.68 | 2.85 | 0.25 | dark green |
| 15 | YL-3 | 0.36 | 0.18 | 3.19 | 0.75 | 2.87 | 0.23 | dark green |

While all of the above masking films Nos. 1–15 exhibited good light-blocking property, the masking films No. 1 and 7 are disadvantageous because of their yellowish color (causing strains of eyes). The masking films Nos. 8–15 which are dark green are also disadvantageous because of their poor see-through property.

various yellow colorants were tested for their chromaticity coordinates (in accordance with JIS Z 8722-1982), optical densities (Macbeth densitometer) and color tones (with eys). The results are shown in Table 3-1 and 3-2. While the tested yellow colorants show good light-blocking property, dark yellow colorants fail to give light green color when blended with a blue colorant.

TABLE 3-1

| Colorant | Chromaticity Coordinate x | Chromaticity Coordinate y | Optical Density Dr | Optical Density Dg | Optical Density Db | Color tone |
|---|---|---|---|---|---|---|
| Valifast yellow 2110 | 0.4423 | 0.4964 | 0.08 | 0.09 | 0.93 | light yellow |

TABLE 3-1-continued

| Colorant | Chromaticity Coordinate | | Optical Density | | | Color tone |
|---|---|---|---|---|---|---|
| | x | y | Dr | Dg | Db | |
| Valifast yellow 1101 | 0.4643 | 0.4988 | 0.05 | 0.09 | 1.14 | light yellow |
| Valifast yellow 1105 | 0.4810 | 0.4970 | 0.07 | 0.14 | 1.39 | light yellow |
| Aizen sot yellow-1 | 0.5574 | 0.7387 | 0.06 | 0.52 | 2.36 | dark yellow |
| Aizen sot yellow-4 | 0.4774 | 0.4993 | 0.05 | 0.11 | 1.34 | light yellow |
| Oleosol fast yellow GCN | 0.5163 | 0.4762 | 0.08 | 0.28 | 1.97 | light yellow |
| Mihara oil yellow 3G | 0.4602 | 0.4970 | 0.05 | 0.09 | 1.06 | light yellow |
| Mihara oil yellow 5G | 0.5608 | 0.4344 | 0.06 | 0.55 | 2.19 | dark yellow |
| Mihara oil yellow 10G | 0.4317 | 0.4851 | 0.06 | 0.08 | 0.94 | light yellow |
| Kayaset yellow K-RL | 0.5110 | 0.4820 | 0.07 | 0.21 | 1.96 | light yellow |
| Savinyl yellow 2GLS | 0.4516 | 0.5039 | 0.06 | 0.10 | 1.01 | light yellow |
| Sudan yellow 150 | 0.5619 | 0.4342 | 0.06 | 0.56 | 2.35 | dark yellow |
| Neopen yellow 075 | 0.4496 | 0.5129 | 0.05 | 0.06 | 1.06 | light yellow |

TABLE 3-2

| Colorant | Chromaticity Coordinate | | Optical Density | | | Color tone |
|---|---|---|---|---|---|---|
| | x | y | Dr | Dg | Db | |
| Valifast yellow 1103 | 0.4462 | 0.5072 | 0.05 | 0.06 | 0.98 | light yellow |
| Oil yellow 107 | 0.4619 | 0.4990 | 0.05 | 0.09 | 1.08 | light yellow |
| Macralex yellow 6G | 0.4517 | 0.5150 | 0.05 | 0.06 | 1.08 | light yellow |
| Macralex yellow 3G | 0.4452 | 0.5041 | 0.05 | 0.07 | 1.95 | light yellow |
| Valifast yellow 4120 | 0.4885 | 0.4959 | 0.07 | 0.19 | 1.90 | light yellow |
| Savinyl yellow 2RLS | 0.5558 | 0.4408 | 0.08 | 0.53 | 2.44 | dark yellow |
| Savinyl yellow RLS | 0.5045 | 0.4866 | 0.06 | 0.18 | 1.84 | light yellow |
| Spilon yellow GRLH special | 0.5031 | 0.4867 | 0.07 | 0.18 | 1.72 | light yellow |
| Orasol yellow 3R | 0.5351 | 0.4619 | 0.10 | 0.38 | 2.68 | dark yellow |
| Neozapon yellow GR | 0.5008 | 0.4851 | 0.06 | 0.15 | 1.66 | light yellow |
| Savinyl yellow 2RLS and Oil yellow 107 (6:4) | 0.5348 | 0.4539 | 0.08 | 0.38 | 1.90 | light yellow |
| Savinyl yellow 2RLS and Oil yellow 107 (2:8) | 0.4985 | 0.4815 | 0.05 | 0.19 | 1.43 | light yellow |

EXAMPLE 5

Figure 3:
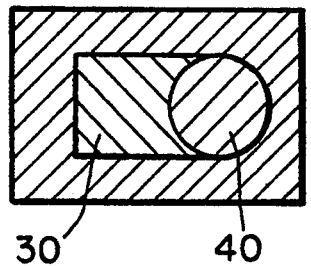
FIG. 3 is an illustration showing the state where the lightsafe masking films of FIGS. 2(a) and 2(b) are superimposed.

Two negative films 1 and 2 having patterns 3 and 4, respectively, were prepared by color separation of a color image to be processed. Similar pairs of negative films were prepared for each of the separated colors (cyan, magenta, yellow and black) so that a total of 8 negative films were obtained. The pattern 4 was a stet while the pattern 3 was a dele. A right end, semicircular portion of the pattern 3 was to be deleted and substituted by the stet pattern 4. A light green masking pattern 10 obtained in Example 1 was cut and peeled to leave a transparent window 30 corresponding in shape to the pattern 3. A commercially available, amber masking pattern 20 was cut and peeled to leave a transparent window 40 corresponding to the pattern 3. When the two masking films 10 and 20 were superimposed, as shown in FIG. 3, the window portion 40 corresponding to the stet pattern 4 was clearly seen as a light green pattern while the window portion 30 corresponding to the dele pattern 3 was clearly seen as an amber pattern. Thus, because of the difference in color, it was easy to determine that the two window portions 30 and 40 were properly shaped correspondingly to the final desired pattern. It was also very easy to determine that the pattern 3 was the dele and the pattern 4 was the stet because of the difference in color between the windows 30 and 40 in the superposed state.

A lith-type film for the formation of a positive was then overlaid with the masking film 30, on which the negative film 1 was further superposed. The lith-type film was exposed to UV rays. After the masking film 40 and the negative film 2 had been replaced for the masking film 30 and the negative film 1, a second exposure was carried out. The lith-type film was thereafter developed to obtain a positive film. Above procedures were repeated for each of the four different separated colors thereby obtaining a total of four positive films.

EXAMPLE 6

A coating liquid having the composition shown in Table 4 below was prepared.

TABLE 4

| Ingredient | Amount (parts) |
|---|---|
| Colorant YL-1*1 | 4.0 |
| Colorant YL-2*2 | 2.41 |
| Colorant BL-1*3 | 0.275 |
| Acrylonitrile/butadiene rubber*5 | 30 |
| Vinyl chloride/vinylidene chloride copolymer*6 | 70 |
| ackiness reducing agent*7 | 1.5 |
| Methyl ethyl ketone | 439 |

*1–*3 and *5–*7: the same as above

The coating liquid was applied to the surface of a polyethylene terephthalate film (thickness: 100 μm) and the coated layer was dried to obtain a masking film having a light green, peelable, lightsafe layer having a thickness of 25 μm. The masking film was able to block light having a wavelength of 450 nm or less and showed a spectral transmittance peak at 545 nm as shown in FIG. 4. The transmittance at that peak was over 50%. The masking film was superimposed on an original and cut lines were manually formed by tracing with a knife. The pattern of the original was clearly seen through the film. The cutting works was able to be carried out efficiently without encountering eye strain problems. The film was found to be effectively used for masking a roomlight photosensitive material.

What is claimed is:

1. A lightsafe masking film comprising a transparent substrate, and a transparent, lightsafe layer peelably provided over the surface of said substrate and containing a light yellow colorant and a blue colorant so that the color of the lightsafe layer is light green and the lightsafe layer can block light having a wavelength of 450 nm or less, said lightsafe layer having a maximum spectral transmittance of greater than 50% in the wavelength region of 500–570 nm.

2. An exposure method wherein a photosensitive material is exposed to actinic light while masking desired portions thereof with lightsafe mask means, said method being characterized in that at least two different, first and second, transparent masking films are used as said lightsafe mask means, that said first masking film has a light green color and said second masking film has a yellow or amber color and that said first masking film includes a lightsafe layer containing a light yellow colorant and a blue colorant so that the color of said first masking film is light green, said lightsafe layer blocking light having a wavelength of 450 nm or less and having a maximum spectral transmittance of greater than 50% in the wavelength region of 500–570 nm.

* * * * *